United States Patent
Schmidt

(10) Patent No.: US 7,456,661 B2
(45) Date of Patent: Nov. 25, 2008

(54) PHASE-LOCKED/FREQUENCY-LOCKED LOOP AND PHASE/FREQUENCY COMPARATOR THEREFOR

(75) Inventor: Juergen Schmidt, Dachau (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 117 days.

(21) Appl. No.: 10/549,332

(22) PCT Filed: Feb. 9, 2004

(86) PCT No.: PCT/EP2004/001154

§ 371 (c)(1),
(2), (4) Date: Aug. 2, 2006

(87) PCT Pub. No.: WO2004/082144

PCT Pub. Date: Sep. 23, 2004

(65) Prior Publication Data

US 2007/0035343 A1    Feb. 15, 2007

(30) Foreign Application Priority Data

Mar. 13, 2003 (DE) .................... 103 11 049

(51) Int. Cl.
    *H03D 13/00* (2006.01)
(52) U.S. Cl. .................... 327/3; 327/2; 327/12; 327/40
(58) Field of Classification Search .......... 327/2, 327/3, 7, 12, 39, 40, 42, 43, 47–49
    See application file for complete search history.

(56) References Cited

U.S. PATENT DOCUMENTS

| | | | |
|---|---|---|---|
| 3,989,931 A | | 11/1976 | Phillips |
| 4,378,509 A | * | 3/1983 | Hatchett et al. ................ 327/5 |
| 4,792,767 A | * | 12/1988 | Lazarus et al. .............. 331/1 A |
| 4,904,948 A | | 2/1990 | Asami |
| 4,959,617 A | * | 9/1990 | Martin ........................ 327/12 |
| 5,436,596 A | * | 7/1995 | Folmer ...................... 331/1 A |
| 6,552,616 B1 | | 4/2003 | Lai et al. |
| 7,102,448 B2 | * | 9/2006 | Chou et al. ................... 331/25 |
| 2002/0118006 A1 | | 8/2002 | Enam et al. |

FOREIGN PATENT DOCUMENTS

| | | |
|---|---|---|
| DE | 19859515 C1 | 4/2000 |
| EP | 0 283 275 A | 9/1988 |
| JP | 2001053603 A | 2/2001 |

OTHER PUBLICATIONS

Best, Roland E, "Phase-Locked Loops," 1997, pp. 91-101, Third Edition, McGraw-Hill, USA.
EP, International Preliminary Report on Patentability.

* cited by examiner

*Primary Examiner*—Lincoln Donovan
*Assistant Examiner*—Hai L. Nguyen
(74) *Attorney, Agent, or Firm*—Ditthavong Mori & Steiner, P.C.

(57) ABSTRACT

A phase/frequency comparator is described which includes two edge-triggered storage elements, each set by an edge of a reference frequency signal of a phase—or frequency-locked loop (PLL) and by an edge of an output frequency signal of the PLL. The storage elements are each reset by an output signal of a resetting logic unit, which is activated when both output signals of the storage elements are activated and then deactivated when the output signals are deactivated.

10 Claims, 5 Drawing Sheets

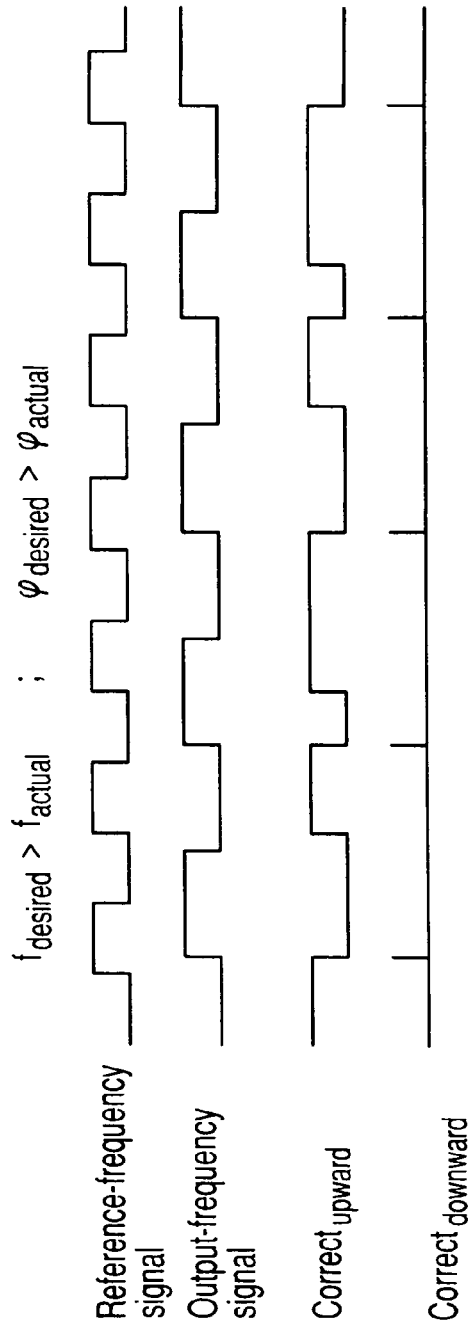
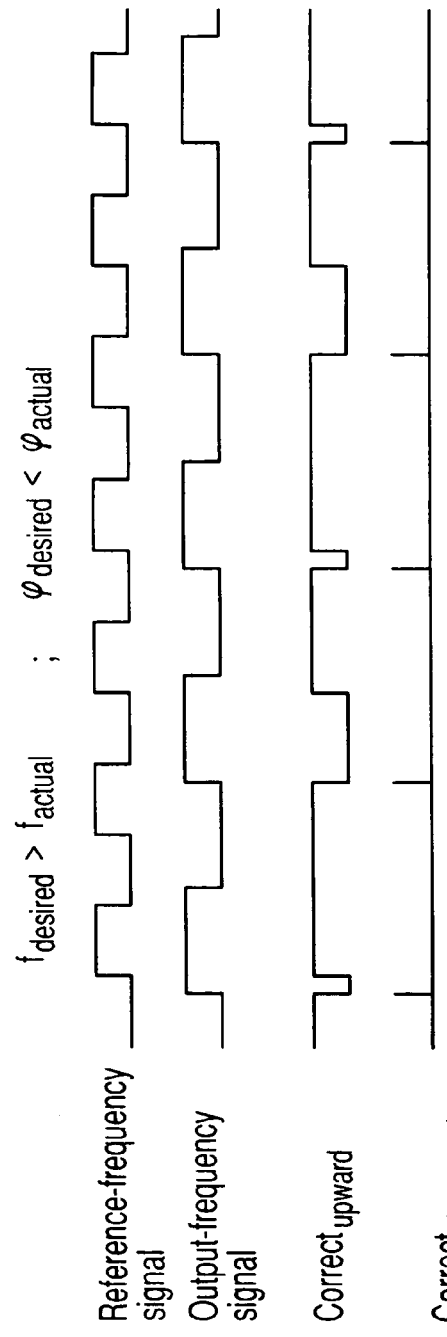

PHASE-LOCKED/FREQUENCY-LOCKED LOOP AND PHASE/FREQUENCY COMPARATOR THEREFOR

FIELD OF THE INVENTION

The invention relates to a stable digital phase/frequency comparator for a phase/frequency-locked loop having resetting logic of a new kind, which comparator is optimised for implementation by programmable logic modules (e.g. FPGA's).

BACKGROUND OF THE INVENTION

What are used to generate signals of exact frequency are generally called PLL circuits (PLL=phase-locked loop). In a PLL circuit, the frequency of a frequency-generating oscillator is set in such a way that it matches a preset reference frequency such that the phase shift between the output frequency of the frequency-generating oscillator and the reference frequency remains stable or constant. In principle, a distinction can be made between analogue and digital PLL circuits. In the case of digital PLL circuits, which are what will be further considered below, the digital implementation is generally confined to the phase/frequency comparator and to the frequency divider which may be implemented as an option.

The task of the phase/frequency comparator is to compare the frequency of an output-frequency signal from a frequency-generating oscillator in the PLL circuits with the frequency of a preset reference-frequency signal and, if there is a difference, to generate one or more correcting signals which correct the frequency of the output-frequency signal from the frequency-generating oscillator in the PLL circuit in the appropriate way. The way in which a phase/frequency comparator is implemented digitally is generally either in the form of an exclusive-OR gate, an edge-triggered JK flip-flop, or a phase/frequency detector using edge-triggered D flip-flops and resetting logic.

The phase/frequency detector using edge-triggered D flip-flops and resetting logic is a variant digital implementation for phase/frequency comparators that is widely employed because it makes the least demands on the input signals (the exclusive-OR gate requires symmetrical input signals, and the edge-triggered JK flip-flop requires input signals which are not subject to fading).

In the case of the phase/frequency detector using edge-triggered flip-flops and resetting logic, the correcting signal for correcting the frequency of the frequency-generating oscillator comprises, as is known from, for example, Roland E. Best, "Phase Locked Loops", 3rd edition, McGraw Hill, 1997, ISBN 0-07-006051-7, pages 91-101, two signals, a first signal for the upward correction of the frequency of the frequency-generating oscillator in the event of a positive difference in frequency between the reference frequency and the output frequency, and a second signal for the downward correction of the frequency of the frequency-generating oscillator in the event of a negative difference in frequency between the reference frequency and the output frequency. These two correcting signals are generated by respective edge-triggered D flip-flops which are set by the reference-frequency signal and the output-frequency signal respectively. Because of the phase and frequency relationships which are possible between the reference-frequency signal and the output-frequency signal, there are a total of four possible states for the two D flip-flop outputs (00, 01, 10, 11). Because the last state (11) of the two flip-flop outputs makes no sense (frequency of frequency-generating oscillator to be corrected upward and downward simultaneously), if this state occurs the two flip-flops are reset by means of resetting logic. What is generally used for this purpose is an AND gate whose inputs are connected to the outputs of the two flip-flops and whose output is connected to the resetting inputs of the two flip-flops.

The phase/frequency comparator thus has an asynchronous structure employing feedback, whose behaviour in operation can be characterised as follows: in a phase/frequency detector using edge-triggered D flip-flops, plus resetting logic as above, in the event of a positive difference in frequency (reference frequency $f_{desired}$>output frequency $f_{actual}$) the output of the flip-flop which is set by the reference-frequency signal (signal: $Correct_{upward}$) is set for longer, as a statistical mean, than the flip-flop which is set by the output-frequency signal (signal: $Correct_{downward}$). In the event of a negative difference in frequency (reference frequency $f_{desired}$<output frequency $f_{actual}$), the output of the flip-flop which is set by the output-frequency signal is set for longer, as a statistical mean, than the flip-flop which is set by the reference-frequency signal. These relationships are shown in FIGS. 1A to 1D for positive and negative differences in frequency $f_{desired}$-$f_{actual}$ between the reference-frequency signal and the output-frequency signal and for positive and negative differences in phase $\phi_{desired}$-$\phi_{actual}$ between the two said signals (to make things clearer, the frequency and phase differences that are assumed to exist in the plots are extreme ones).

If a digital phase/frequency comparator of this kind is implemented with programmable logic modules (e.g. FPGA's PAL's, LCA's), the following problems may arise:

Under certain circumstances, the two edge-triggered D flip-flops may not be reset at exactly the same time. The reason for this may be different transit times for the resetting signals due to different lengths of conductor from the resetting logic to the resetting inputs of the edge-triggered D flip-flops, and different resetting times of the two edge-triggered D flip-flops. In the extreme case, an edge-triggered D flip-flop may not be reset at all because, due to appreciable differences in transit time and resetting time, the resetting signal for the edge-triggered D flip-flop which has not yet been reset may have been cancelled again even before the resetting process has been completed due to the resetting of the other edge-triggered D flip-flop. Generally speaking, it is relatively unlikely that circumstances of this kind, and particularly the extreme case which has been described, will occur but, in programmable logic modules, they cannot be ruled out if the placing of the individual logic units is unsatisfactory.

When programming the logic modules, there is generally only a limited amount the user can do to affect the transit times of the individual signals or the resetting times of the flip-flops, which means that if irregularities of this kind occur, the dynamic performance of the PLL circuit can no longer be accurately controlled. Hence there will no longer be a precise deterministic relationship between on the one hand the two correcting signals from the digital phase/frequency comparator and on the other hand the difference in frequency between the reference frequency and the output frequency. This will lead to undesirable jumps in frequency at the output of the frequency-generating oscillator of the PLL circuit and to drifts in phase between the reference frequency and the output frequency. These system deviations on the part of the phase/frequency-locked loop, which appreciably reduce the quality of the control performed by the PLL circuit, cannot generally be corrected and in the extreme case may cause instability on the part of the control loop.

SUMMARY OF THE INVENTION

A need exists therefore to provide, for a digital phase/frequency-locked loop, suitable resetting logic for the phase/frequency comparator, in which the resetting logic is constructed from edge-triggered storage devices (D flip-flops), in order to obtain deterministic and stable phase/frequency-locking in a digital implementation employing for example programmable logic modules, despite transit-time effects that may occur.

In accordance with one aspect of the invention, in order to obtain resetting processes which are reliable in a defined way for the two edge-triggered storage devices (e.g. D flip-flops), what is used to obtain the resetting signal from the output signals of the edge-triggered storage devices (D flip-flops) is not a static gate module but a digital storage device. What is used for this purpose is for example, preferably, an asynchronous level-triggered RS flip-flop which is only set when both outputs of the two first-mentioned edge-triggered storage devices (D flip-flops) have been set. The resetting signal for the two edge-triggered storage devices (D flip-flops) is only reset when both the edge-triggered storage devices (D flip-flops) have been reset. This ensures that the process of resetting the two edge-triggered storage devices (D flip-flops) comes to an end in a defined way.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 1A, 1b, 1C and 1D show the signals that occur in case of the phase/frequency detector for different differences in frequency and phase.

DESCRIPTION OF THE PREFERRED EMBODIMENT

The resetting logic according to an embodiment of the invention for a digital phase/frequency comparator will be described below by reference to FIGS. 2 to 5. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1C:
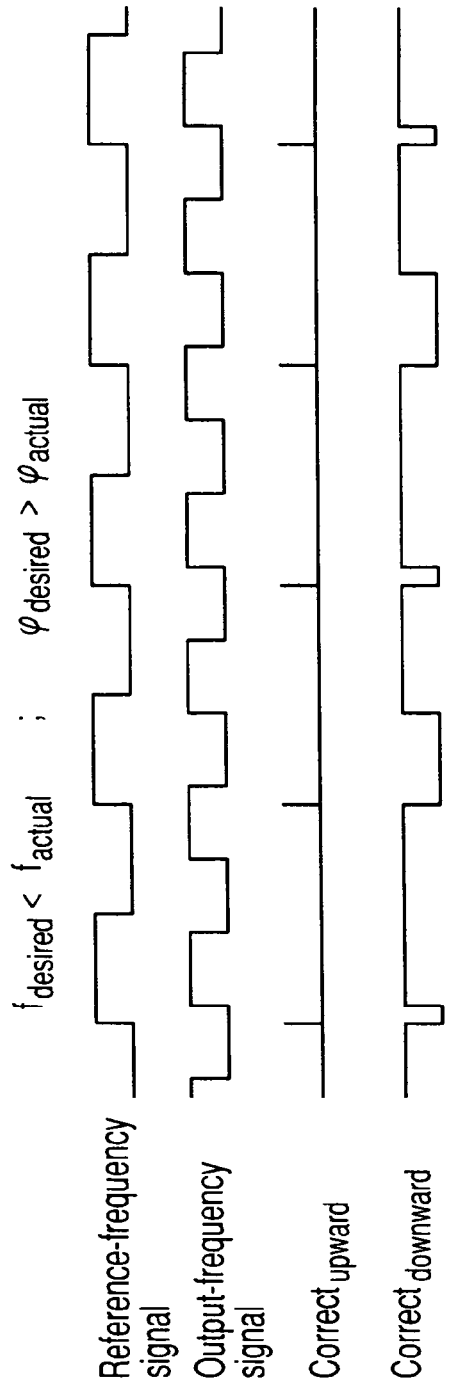
Figure 1D:
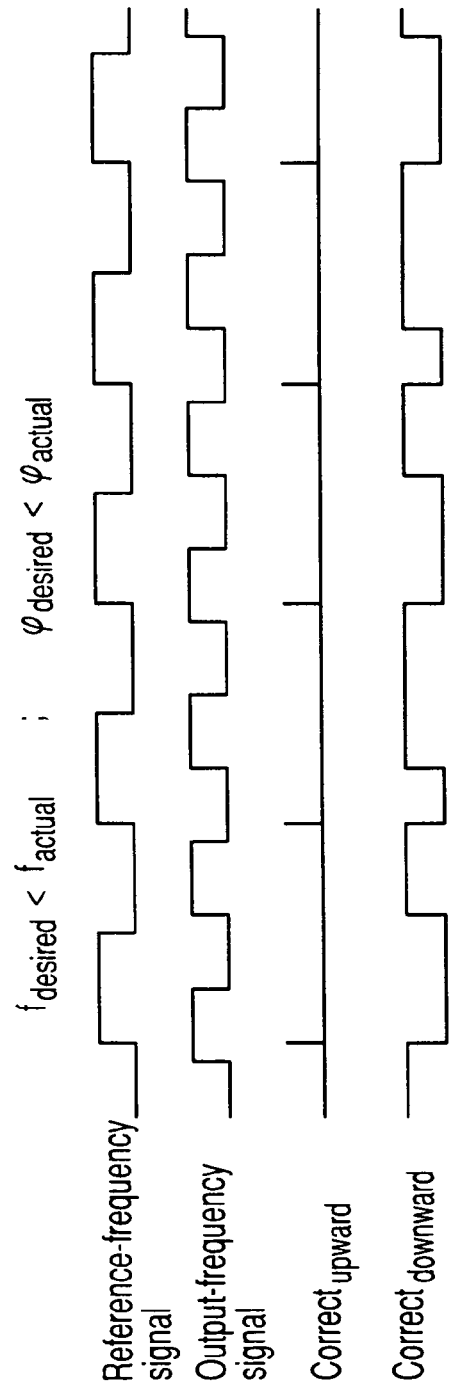
Figure 2:
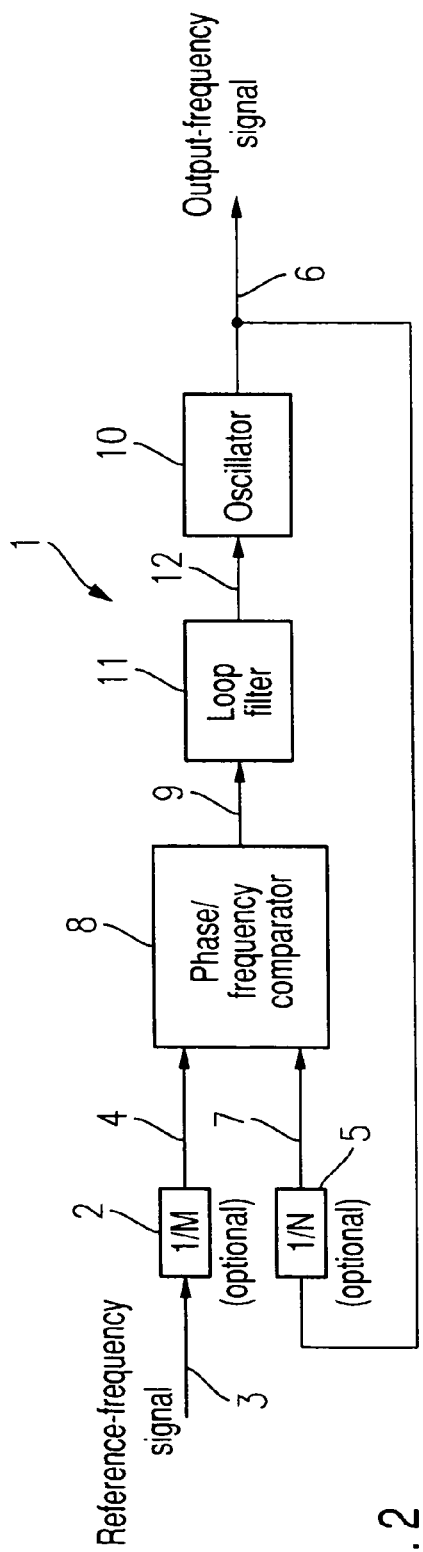
FIG. 2 is a block diagram of a phase/frequency-locked loop.

FIG. 2 is a schematic block diagram of a phase/frequency-locked loop (PLL) 1. The loop 1 comprises a frequency divider 2 to whose input a reference-frequency signal 3 is applied. The frequency of the reference-frequency signal is divided in the frequency divider 2 by a factor M. The reference-frequency signal 4, of a frequency obtained by dividing by the factor M, is emitted from the output of the frequency divider 2. The phase/frequency-locked loop 1 has a second frequency divider 5 which divides the frequency of the output-frequency signal 6 which is applied to its input by a factor N. The output-frequency signal 7, of a frequency obtained by dividing by the factor N, is emitted from the output of the frequency divider 5. By selecting M and N in a suitable way, it must be ensured that the reference-frequency signal 3 whose frequency has been divided by the factor M, and the output-frequency signal 6 whose frequency has been divided by the factor N, are of the same frequency when the phase/frequency-locked loop 1 is in a steady-state (settled) condition. Both the frequency divider 2 and the frequency divider 5 are optional functional units within the phase/frequency-locked loop.

The reference-frequency signal 4 and the output-frequency signal 7, whose frequencies may have been divided, as an option, in frequency dividers 2 and 5[1] respectively, are fed to respective inputs of a phase/frequency comparator 8. In the phase/frequency comparator 8, the two frequencies or phases of the reference-frequency signal 4 and the output-frequency signal 7 are compared. The comparison produces a correcting variable 9 to correct a frequency-generating oscillator 10, which is generally current-controlled or voltage-controlled. The correcting variable 9 comprises the two correcting signals $Correct_{upward}$ 9A to correct the frequency of the frequency-generating oscillator 10 upwards and $Correct_{downward}$ 9B to correct the frequency of the frequency-generating oscillator 10 downwards.

[1] Translator's note: Mis-identified in the original as 3.

The correcting variable 9, in the form of its two correcting signals $Correct_{upward}$ 9A and $Correct_{downward}$ 9B, is fed to the input of a loop filter 11. The loop filter has a given characteristic dynamic response which enables it to have a targeted influence on the dynamic behaviour of the phase/frequency-locked loop in respect of stability. The output signal 12 from the loop filter 11 is fed to the input of the frequency-generating oscillator 10 to control the frequency of the output-frequency signal 6.

In this way, the frequency of the output-frequency signal 6 is controlled to suit the variation over time of the frequency of the reference-frequency signal 3, as a function of the gain of the phase/frequency-locked loop 1, which gain is determined by, amongst other things, the dividing factors N and M of the frequency dividers 2 and 5. If there is a change in the frequency of the reference-frequency signal 3 over time or if a disruption occurs which affects the phase/frequency-locked loop 1, the dynamic response of the phase-frequency-locked loop 1 is determined by the dynamic behaviour of the individual functional units in the phase/frequency-locked loop 1, and particularly that of the loop filter 1 and the frequency-generating oscillator 10.

Whereas the loop filter 11 and the frequency-generating oscillator 10 are functional units which are often implemented in analogue form, the frequency dividers 2 and 5 and the phase/frequency comparator 8 may be implemented in analogue or digital form. In the case of digital implementation, the phase/frequency detector (PFD) employing edge-triggered D flip-flops and resetting logic which will be used in the vast majority of applications will be further described below.

Figure 3:
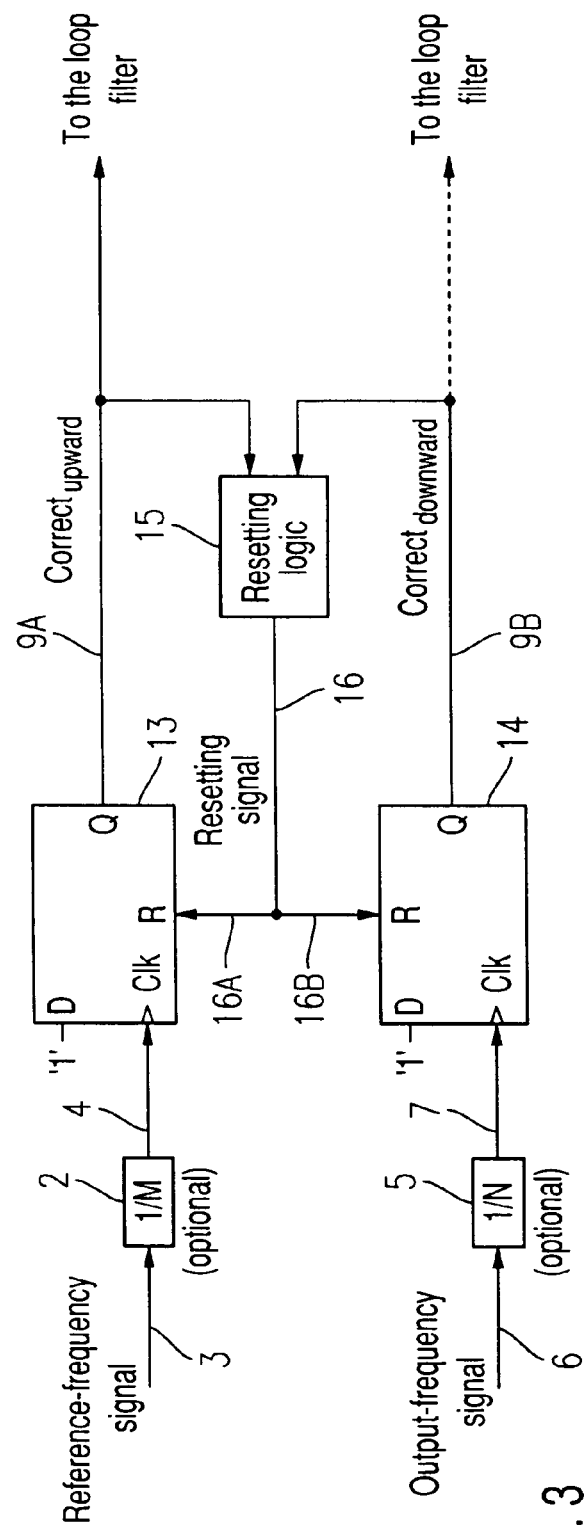
FIG. 3 is a block diagram of a phase/frequency comparator.

A block circuit diagram of the phase/frequency detector (PFD) is shown in FIG. 3. The PFD comprises two edge-triggered storage devices 13 and 14, which are preferably edge-triggered D flip-flops. In the case of the edge-triggered D flip-flop 13, when a positive-going edge of the reference-frequency signal 4, whose frequency may, as an option, have been divided in the frequency divider 2, is applied to the clock input Clk, the level present at input D, which is set to a constant logic "1", is switched to the output Q. The correcting signal $Correct_{upward}$ 9A which is present at the output Q of the D flip-flop 13 is used to correct the frequency of the frequency-generating oscillator 10 upwards. In a similar way, in the case of the edge-triggered D flip-flop 14, when a positive-going edge of the output-frequency signal 7, whose frequency may, as an option, have been divided in the frequency divider 5, is applied to the clock input Clk, the level present at input D, which is set to a constant logic "1", is switched to the output Q. The correcting signal $Correct_{downward}$ 9B which is present at the output Q of the D flip-flop 14 is used to correct the frequency of the frequency-generating oscillator 10 downwards. The two correcting signals $Correct_{upward}$ 9A and $Correct_{downward}$ 9B are fed to the inputs of the resetting logic 15.

In the prior art, the resetting logic 15 comprises an AND gate. The resetting logic 15 generates a resetting signal 16, which is fed to the resetting input R of the D flip-flop 13 as a resetting signal 16A and to the resetting input R of the D flip-flop 14 as a resetting signal 16B. Hence, if the two outputs Q of the two D flip-flops 13 and 14 are set simultaneously, the output of the resetting logic 15 is also activated and this, via the resetting signals 16A and 16B to their respective resetting inputs R, causes the two D flip-flops 13 and 14 to be reset.

Figure 4:
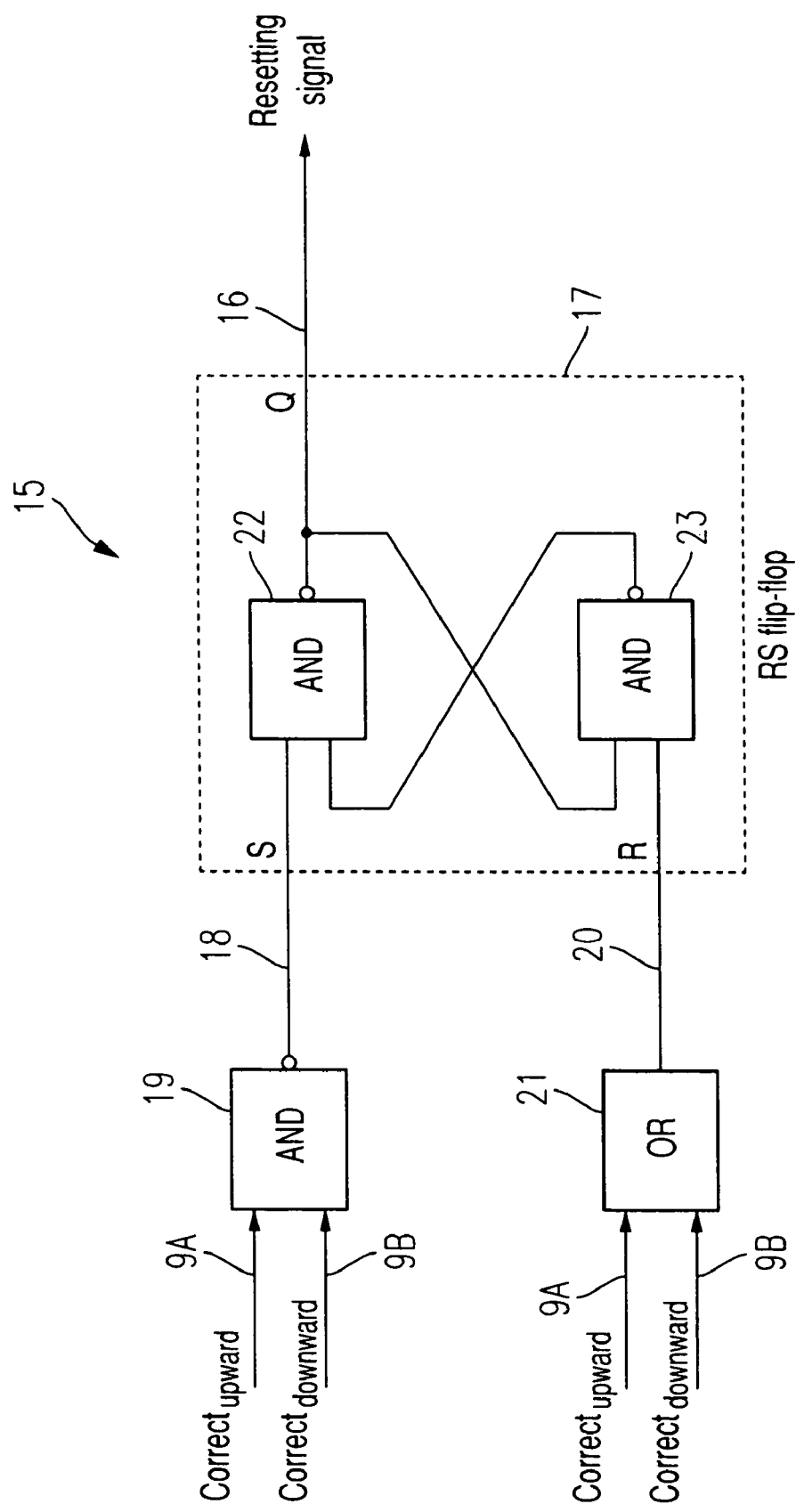
FIG. 4 is a block diagram of a first embodiment of resetting logic.

In a first embodiment of the resetting logic 15, which is shown in FIG. 4, use is made of an asynchronous level-triggered RS flip-flop 17 whose logic is inverse (=low is active). The setting input S of the asynchronous level-triggered RS flip-flop 17 has the output signal 18 from an inverted AND gate 19 supplied to it. The two correcting signals $Correct_{upward}$ 9A and $Correct_{downward}$ 9B are fed to the inputs of the inverted AND gate 19. The output signal 20 from an OR gate 21 is fed to the resetting input R of the asynchronous level-triggered RS flip-flop 17. The two inputs of the OR gate 21 have the two correcting signals $Correct_{upward}$ 9A and $Correct_{downward}$ 9B supplied to them. The resetting signal 16 is generated at the output Q of the asynchronous level-triggered RS flip-flop 17. To implement the inverse logic, the asynchronous level-triggered RS flip-flop 17 has an inverted AND gate 22 whose output is connected to the output Q and whose inputs have the input S and the output of a further inverted AND gate 23 supplied to them. The inputs of the further inverted AND gate 23 have the resetting input R and the output of the first inverted AND gate 22 supplied to them.

If the two correcting signals $Correct_{upward}$ 9A and $Correct_{downward}$ 9B are activated simultaneously ("1" state), the output signal 18 from the inverted AND gate 19, and hence the setting input S of the asynchronous level-triggered RS flip-flop 17, are activated (are set to the "0" state). At the same time, the output signal 20 from the OR gate 21, and hence the resetting input R of the asynchronous level-triggered RS flip-flop 17, are deactivated (are set to the "1" state). Because of the inverse logic of the RS flip-flop 17, the output Q and hence the resetting signal 16 are set. If on the other hand the two correcting signals $Correct_{upward}$ 9A and $Correct_{downward}$ 9B are de-activated simultaneously ("0" state), the output signal 18 from the inverted AND gate 19, and hence the setting input S of the RS flip-flop 17, are set to the "1" state. The output signal 20 from the OR gate 21, and hence the resetting input R of the RS flip-flop 17, are set to the "0" state. Because of the inverse logic of the flip-flop, the output Q of the RS flip-flop 17 is reset.

This ensures that the resetting signal 16 is set when the two correcting signals $Correct_{upward}$ 9A and $Correct_{downward}$ 9B have been set. Resetting of the resetting signal 16 only takes place when the two correcting signals $Correct_{upward}$ 9A and $Correct_{downward}$ 9B are reset simultaneously. In this way, the frequency of the frequency-generating oscillator 10 can be corrected in line with the nature of the correcting signals $Correct_{upward}$ 9A and $Correct_{downward}$ 9B without causing any unwanted jumps in frequency and hence instabilities in the phase/frequency-locked loop. The behaviour of the PLL circuit is thus behaviour which can be controlled.

Figure 5:
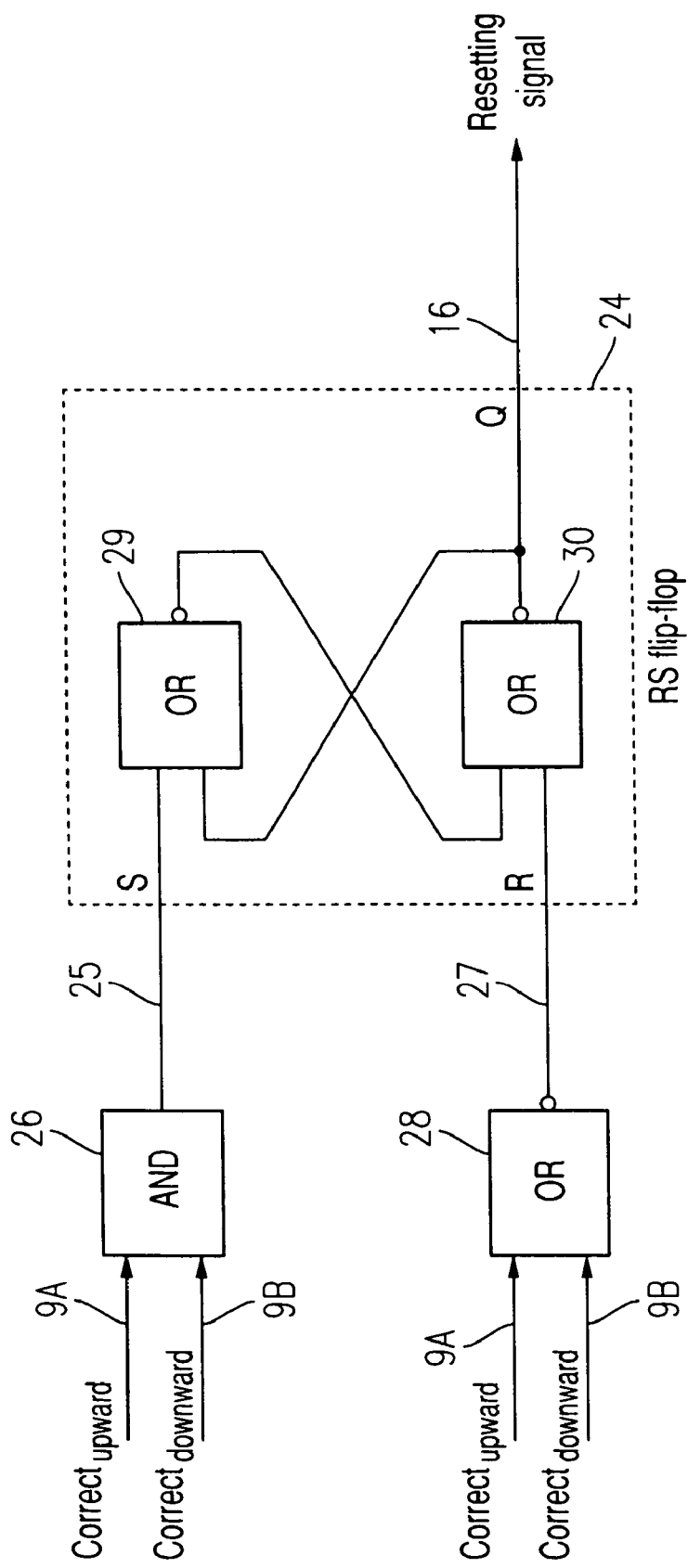
FIG. 5 is a block diagram of a second embodiment of resetting logic.

In a second embodiment of the resetting logic 15, which is shown in FIG. 5, use is made of an asynchronous level-triggered RS flip-flop 24 which is of non-inverse logic. The setting input S of the asynchronous level-triggered RS flip-flop 24 has the output signal 25 from an AND gate 26 supplied to it. The two correcting signals $Correct_{upward}$ 9A and $Correct_{downward}$ 9B are fed to the inputs of the AND gate 26. The output signal 27 from an inverted OR gate 28 is fed to the resetting input R of the asynchronous level-triggered RS flip-flop 24. The two inputs of the inverted OR gate 28 have the two correcting signals $Correct_{upward}$ 9A and $Correct_{downward}$ 9B supplied to them. The resetting signal 16 is generated at the output Q of the asynchronous level-triggered RS flip-flop 24. To implement the non-inverse logic, the asynchronous level-triggered RS flip-flop 24 has an inverted OR gate 29 whose output is connected to the output Q and whose inputs have the input S and the output of a further inverted OR gate 30 supplied to them. The inputs of the further inverted OR gate 30 have the resetting input R and the output of the first inverted OR gate 29 supplied to them.

If the two correcting signals $Correct_{upward}$ 9A and $Correct_{downward}$ 9B are activated simultaneously ("1" state), the output signal 25 from the AND gate 26, and hence the setting input S of the asynchronous level-triggered RS flip-flop 24, are activated ("1" state). At the same time, the output signal 27 from the inverted OR gate 28, and hence the resetting input R of the asynchronous level-triggered RS flip-flop 24, are not set ("0" state). Because of the non-inverted logic of the RS flip-flop 24, the output Q and hence the resetting signal 16 are set. If on the other hand the two correcting signals $Correct_{upward}$ 9A and $Correct_{downward}$ 9B are de-activated simultaneously ("0" state), the output signal 25 from the AND gate 26, and hence the setting input S of the RS flip-flop, are reset ("0" state). The output signal 27 from the inverted OR gate 28, and hence the resetting input R of the RS flip-flop 24, are activated ("1" state). Because of the non-inverted logic of the flip-flop, the output Q of the RS flip-flop 24 is reset.

In this embodiment too, having an asynchronous level-triggered RS flip-flop 24 and non-inverted logic, it is ensured that the resetting signal 16 is set only when the two correcting signals $Correct_{upward}$ 9A and $Correct_{downward}$ 9B have been set simultaneously. Resetting of the resetting signal 16 only takes place when the two correcting signals $Correct_{upward}$ 9A and $Correct_{downward}$ 9B have been reset. In this embodiment too the behaviour of the PLL circuit is thus behaviour which is controllable because no unwanted jumps in frequency occur, and there are thus no instabilities in the phase/frequency-locked loop.

What is claimed is:

1. A circuit for a phase/frequency-locked loop comprising:
a frequency-generating oscillator; and
a phase/frequency comparator having two edge-triggered storage devices including a first edge-triggered storage device set by an edge of a reference-frequency signal and a second edge-triggered storage device set by an edge of an output-frequency signal from the phase/frequency locked loop, the two edge-triggered storage devices are each reset by a resetting signal that is output from a resetting logic unit, the two edge-triggered storage devices have output signals that are connected to the frequency-generating oscillator, said resetting logic unit having inputs that are supplied with the output signals from the two edge-triggered storage devices,
wherein the resetting signal from the resetting logic unit is only activated when both the output signals from the two edge-triggered storage devices have been activated, and is only de-activated when both the output signals from the two edge-triggered storage devices have been deactivated,
wherein the resetting logic unit includes an asynchronous level-triggered RS storage device of inverse logic, the resetting input of the asynchronous level-triggered RS storage device having an output signal from an OR gate supplied to it, and
wherein the two edge-triggered storage devices each have only a single output, the single output of each of the two edge-triggered storage devices being of non-inverted logic.

2. A circuit according to claim 1, wherein:
the frequency of the output-frequency signal from the phase/frequency-locked loop is reduced by a factor M by a frequency divider, upstream of the input of the phase/frequency comparator.

3. A circuit according to claim 1, wherein:
the output signals of the two edge-triggered storage devices are connected to the frequency-generating oscillator via an interposed loop filter for stabilizing the phase-frequency-locked loop.

4. A circuit according to claim 1, wherein:
the frequency of the reference-frequency signal to the phase/frequency-locked loop is reduced by a factor N by a frequency divider, upstream of the input of the phase/frequency comparator.

5. A circuit according to claim 4, wherein: the frequency of the output-frequency signal from the phase/frequency-locked loop is reduced by a factor M by a frequency divider, upstream of the input of the phase/frequency comparator.

6. A circuit according to claim 1, wherein:
the output of the first edge-triggered storage device, is fed to the frequency-generating oscillator to increase the frequency of the output-frequency signal, and the output of the second edge-triggered storage device, is fed to the frequency-generating oscillator to reduce the frequency of the output-frequency signal.

7. A circuit according to claim 6, wherein:
the output signals of the two edge-triggered storage devices are connected to the frequency-generating oscillator via an interposed loop filter for stabilizing the phase-frequency-locked loop.

8. A circuit according to claim 6, wherein:
the frequency of the reference-frequency signal to the phase/frequency-locked loop is reduced by a factor N by a frequency divider, upstream of the input of the phase/frequency comparator.

9. A circuit according to claim 6, wherein:
the frequency of the output-frequency signal from the phase/frequency-locked loop is reduced by a factor M by a frequency divider, upstream of the input of the phase/frequency comparator.

10. A phase/frequency comparator for a phase/frequency-locked loop, comprising:
two edge-triggered storage devices including a first edge-triggered storage device set by an edge of a reference-frequency signal for the phase/frequency-locked loop, and a second edge-triggered storage device set by an edge of an output-frequency signal from the phase/frequency-locked loop, the two edge-triggered storage devices are each reset by a resetting signal that is output from a resetting logic unit, said resetting logic unit having inputs that are supplied with the output signals from the two edge-triggered storage devices,
wherein the resetting signal from the resetting logic unit is only activated when both the output signals from the two edge-triggered storage devices have been activated, and is only de-activated when both the output signals from the two edge-triggered storage devices have been deactivated,
wherein the resetting logic unit includes an asynchronous level-triggered RS storage device of inverse logic, the resetting input of the asynchronous level-triggered RS storage device having an output signal from an OR gate supplied to it, and
wherein the two edge-triggered storage devices each have only a single output, the single output of each of the two edge-triggered storage devices being of non-inverted logic.

* * * * *